United States Patent [19]
Wenger et al.

[11] Patent Number: 5,325,270
[45] Date of Patent: Jun. 28, 1994

[54] MODULAR BACKPLANE

[75] Inventors: Gary T. Wenger, Duxbury; Richard B. Moore, Bridgewater; James J. Lane, Jr., Sagamore; David Chastain, Acton; James Stark, Millbury; Louis Pedraza, Hyde Park, all of Mass.

[73] Assignee: Telco Systems, Inc., Norwood, Mass.

[21] Appl. No.: 890,693

[22] Filed: May 29, 1992

[51] Int. Cl.$^5$ .......................... H05K 7/00; H05K 7/16
[52] U.S. Cl. ..................................... 361/797; 361/796; 439/61
[58] Field of Search .................. 439/61; 361/393, 394, 361/399, 412, 413, 415

[56] References Cited
U.S. PATENT DOCUMENTS
5,103,378 4/1992 Stowers et al. .................. 439/61

*Primary Examiner*—Gary F. Paumen
*Attorney, Agent, or Firm*—Wolf, Greenfield & Sacks

[57] ABSTRACT

A flexible backplane assembly is provided wherein removable backplane modules are mounted in a platform in a manner such that the backplane modules may be removed and replaced to accommodate different types of circuit modules. Coacting guides are provided on the platform and the backplane modules to define a travel path for module insertion and removal which prevents contact with adjacent circuit and backplane modules and maneuvers around platform structural members. Connectors at the rear of each backplane module for mating withy circuit module connectors may be electrically connected to I/O boards at the front of the module to permit wiring of the backplane modules from the front of the platform.

26 Claims, 10 Drawing Sheets

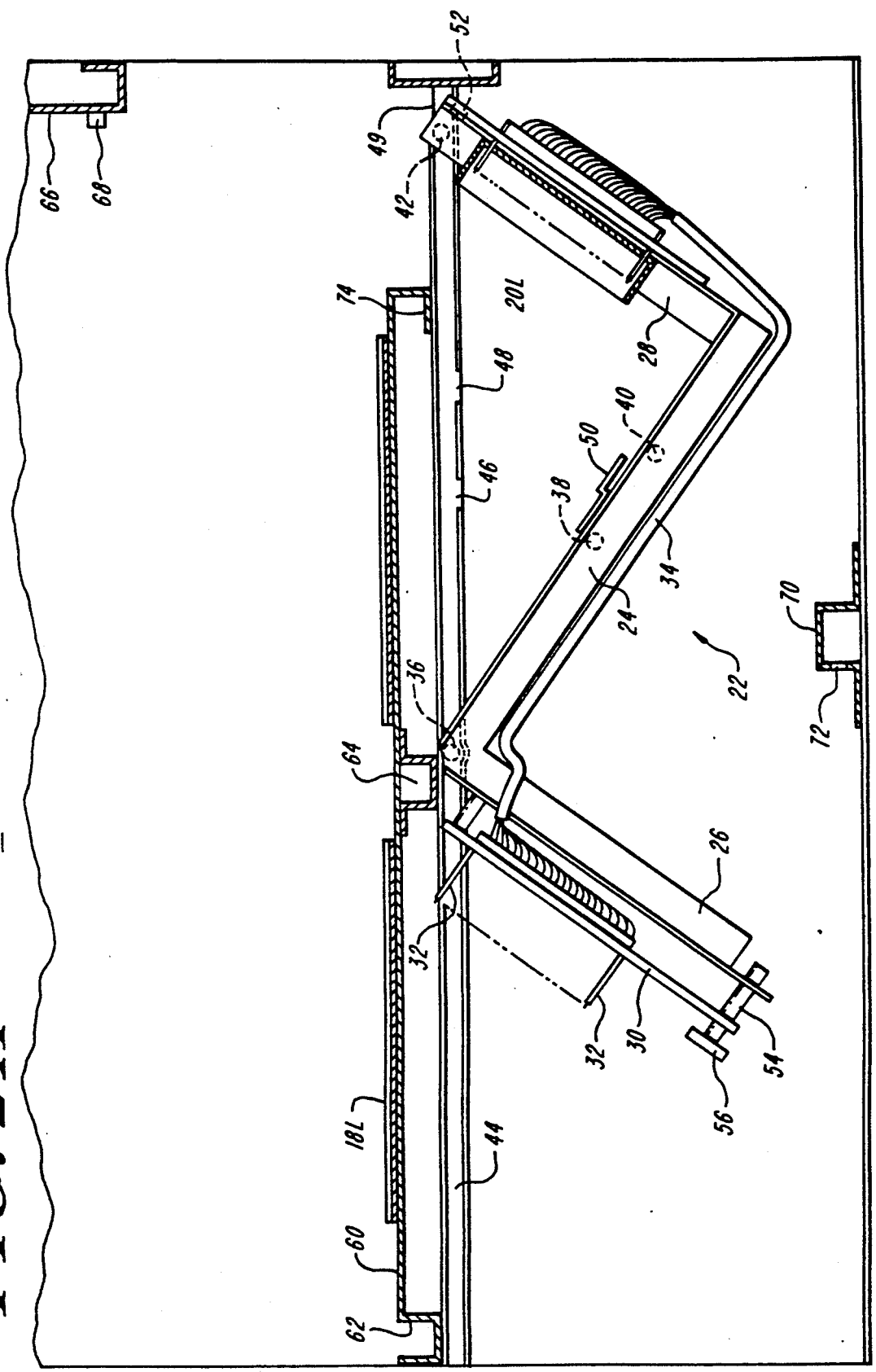

MODULAR BACKPLANE

FIELD OF THE INVENTION

This invention relates to electrical backplanes used for connection to electronic circuit modules and more particularly to such backplanes which may have their configuration easily altered for use with different types or classes of circuit modules.

BACKGROUND OF THE INVENTION

Electronic backplanes are utilized in circuit platforms for telephony, computer and other electronic systems to permit various circuit boards, cards or other circuit modules to be interconnected or to be connected to external circuitry. In the following, a circuit platform or platforms will be considered to be a backplane and associated card cage or other circuit module support elements. In some instances, the term may also encompass the circuit modules mounted in the support. A platform may accommodate a varying number of circuit modules depending on application.

Typically, such backplanes have one or more connectors for each circuit module, each connector having a plurality of terminals which on one side mate with matching terminals on the corresponding circuit board and which are hard-wired on the other side to terminals in the backplane or through other connectors to external circuitry. Multiple connectors may be provided for each circuit module. A runner in the platform facilitates insertion and removal of the circuit modules, the connector(s) of the circuit module mating with the backplane connector(s) when the circuit module is fully inserted.

Platforms of this type are useful for permitting circuit modules of a particular type to be easily removed and replaced for preventive maintenance, to replace a defective circuit module, or to replace an existing module with an updated or improved module. However, such backplane platforms offer little flexibility where it is desired or required to use circuit modules of different types, having circuitry interconnects which are sufficiently different so as to require different connectors and different wiring on the backplane. In particular, where the circuit modules are switching circuits which are part of a central office telephone switching system, the I/O connections for the circuits may use T1 cable with 56 connections per cable and two cables per module, each cable being formed of twisted pair 22 gauge wire, may use DS3 signal cables which involve six coaxial cables per module, may utilize fiber optic cables with, for example, six fiber optic cables per module, or may utilize some other type of connector and wiring. Further, it may be desired, to have mixed circuit modules on a single platform, with some modules being of one type and some of another type.

In any event, when changes are to be made, it is preferable that it be possible to effect such changes on line without causing an interruption in service for other modules on the same platform. However, it is very difficult to change the backplane wiring for a hard-wired backplane because of space limitations in both the front and the rear of the platform, and it is virtually impossible to change to a different type of I/O connector. Performing such backplane rewiring in the field without interrupting service on adjacent circuits is also very difficult, but is desirable since any contact with adjacent circuits could cause failures in such circuits and might also result in shock, burns or other injuries to a person doing such replacement.

Heretofore, the difficulty of running new cables of a different type into a backplane once the backplane has been installed has been dealt with in some instances by running cables of different types into the backplane, connecting the cables to be utilized, and tying off the remaining cables until such time as their use may be required. However, this procedure only partially simplifies the field replacement problem and results in a significantly more expensive and time-consuming initial installation, both in terms of labor and materials. Further, too many unterminated lines in a backplane may degrade signals and thus performance. There are also space limitations in a backplane which may make installation of extra cables difficult and complicate working on the backplane with the extra cables. Finally, since platforms may be used for many years, frequently in excess of ten years, desired cables, for example fiber optic cable, may not have existed at the time the backplane was installed.

A need, therefore, exists for a more flexible backplane system which permits connectors to be easily replaced in the field to accommodate different types of circuit modules, and which permits any rewiring to be done from the front of the platform where wires can be gotten at easily and without danger of damaging adjacent circuits or of injury to a person doing the installation. Such a technique should permit the path for any replaceable backplane elements or modules to be carefully controlled so as not to cause damage to adjacent circuit modules which are in use, while assuring that replacement components maneuver around structural portions of the platform and that replacement backplane modules are accurately positioned when fully installed.

SUMMARY OF THE INVENTION

In accordance with the above, it is an object of this invention to provide a flexible backplane system which permits at least selected backplane modules to be replaced so as to permit circuit modules with different types of connectors and/or wiring to be utilized with the backplane. Another object of the invention is to permit such replacement to be made without interrupting operation of other backplane and circuit modules in the same platform and, more specifically, without causing contact with such circuit modules or backplane modules. A more specific object of the invention is to permit rewiring of backplane modules to be accomplished in at least some embodiments without requiring access to the rear of the module and without the necessity for running extra wiring into the backplane during initial installation.

In accordance with the above and other objects, this invention provides a platform for mounting circuit modules having at least one circuit connector extending from the rear thereof, which platform has at least one replaceable backplane module. The module may include guide means such as a plurality of sliders on either side of the module, one or more alignment elements, at least one connector which is matable with the circuit module connector and some means for making electrical connection to the backplane module connector. The platform also contains a means which coacts with the guide or sliders on the backplane module to control a travel path for the replaceable backplane module during insertion and removal thereof. More specifically, at least two rails may be provided, which rails are positioned on opposite sides of each replaceable backplane module. The sliders ride in the rails for at least a portion of the travel path for the backplane module during insertion and removal. The platform may also contain at least one alignment element which mates with a corresponding alignment element on the backplane module when the module is properly positioned in the platform.

For some embodiments, each circuit module has two connectors and each replaceable backplane module has one connector for mating with one of the circuit module connectors, the platform including an additional non-replaceable second connector for each circuit module positioned to mate with the other circuit module connector when the circuit module is properly positioned in the platform. The backplane platform connector is preferably toward the rear of the backplane module and an I/O board or other means is preferably mounted to the front of each backplane module for making electrical connection to the backplane module connector from the front of the module.

Alignment between a backplane module and the platform is preferably provided by having a pin on one such element with a mating hole on the other element, the pin and hole fully mating when the backplane module is properly positioned in the platform. For a preferred embodiment, there are a pair of mating alignment elements on the platform and backplane module, and a means is provided for releasably fastening the backplane module to the platform when the backplane module is properly positioned therein.

For various embodiments of the invention, the travel path for a backplane module during insertion and removal includes at least two path segments. One segment is a lateral segment during which the module is oriented in its fully inserted orientation and is moved laterally to or from a fully inserted position. The second path segment is a pivot segment during which the module is pivoted to or from the lateral segment orientation to an angled orientation for facilitating insertion and removal of the backplane module with respect to the platform. A second lateral path segment may also be provided which is performed with the backplane module generally in the angled orientation. During this second lateral segment, the backplane module is moved between a forward end of the platform and a pivot position where the pivot segment is performed. Various guide elements, such as rails and sliders, coact during the various path segments to control and limit movement of the backplane to the selected travel path, assuring that undesired contact is not made with adjacent modules which may be active and that the backplane module is guided around various structural members of the platform.

More specifically, for one embodiment, the platform includes runners for mechanically supporting each circuit module in the platform with the rails for each backplane module being positioned below the runners for the corresponding circuit module, facilitating insertion and removal of a backplane module from below platform structural members.

The backplane module preferably has a main section with an end section containing the backplane connector extending at a generally right angle from the back end thereof. For this embodiment, there is at least one slider on either side of the main section and on either side of the end section. Both sets of sliders may ride in corresponding rails during the second lateral section of the travel path with an opening being provided in a rear portion of each rail through which the end section slider may pass during the pivot section of the travel path. Each backplane module for this embodiment preferably has an end section extending at a generally right angle from the front end thereof, the front end section extending in the opposite direction from the rear end section and having an I/O board mounted thereto. Electrical conductors are provided for interconnecting the I/O board and the backplane module connector. External circuit connections may be made to the I/O board, the board being at the front of the platform when the backplane module is properly positioned and thus easily reached.

For another embodiment, the runners for mechanically guiding and supporting circuit modules may be on the backplane module. Each backplane module also has a main section, the runners being attached to this section, and a connector-containing end section extending at a right angle from the back end of the main section. At least a forward and a rear slider are provided on either side of the main section. For this embodiment, the backplane module is initially oriented during insertion with the back end section elevated above its proper position and the forward slider on each side of the main section in a rail. The backplane module is moved in this general orientation through the second lateral segment of its travel path until the pivot point in the travel path is reached, at which point the lateral position of the module is preferably temporarily locked and the rear end of the backplane module is lowered by being pivoted about the forward sliders until a desired final orientation for the backplane module is reached. At this point, the rear slider on each module engages a corresponding rail. The backplane module is then moved into its final position through the first segment of its travel path with all of the sliders riding in corresponding rails. The procedure described above is reversed for backplane module removal. This module also preferably has a downwardly-extending forward section with an I/O board electrically coupled to the backplane module connector.

The foregoing and other objects, features and advantages of the invention will be apparent from the following more particular description of preferred embodiments of the invention as illustrated in the accompanying drawings.

IN THE DRAWINGS

FIGS. 2A–2C are partially broken away side elevation views taken generally along the line 2—2 in FIG. 1 illustrating various stages in the insertion of a backplane module for this embodiment.

DETAILED DESCRIPTION

Figure 1:
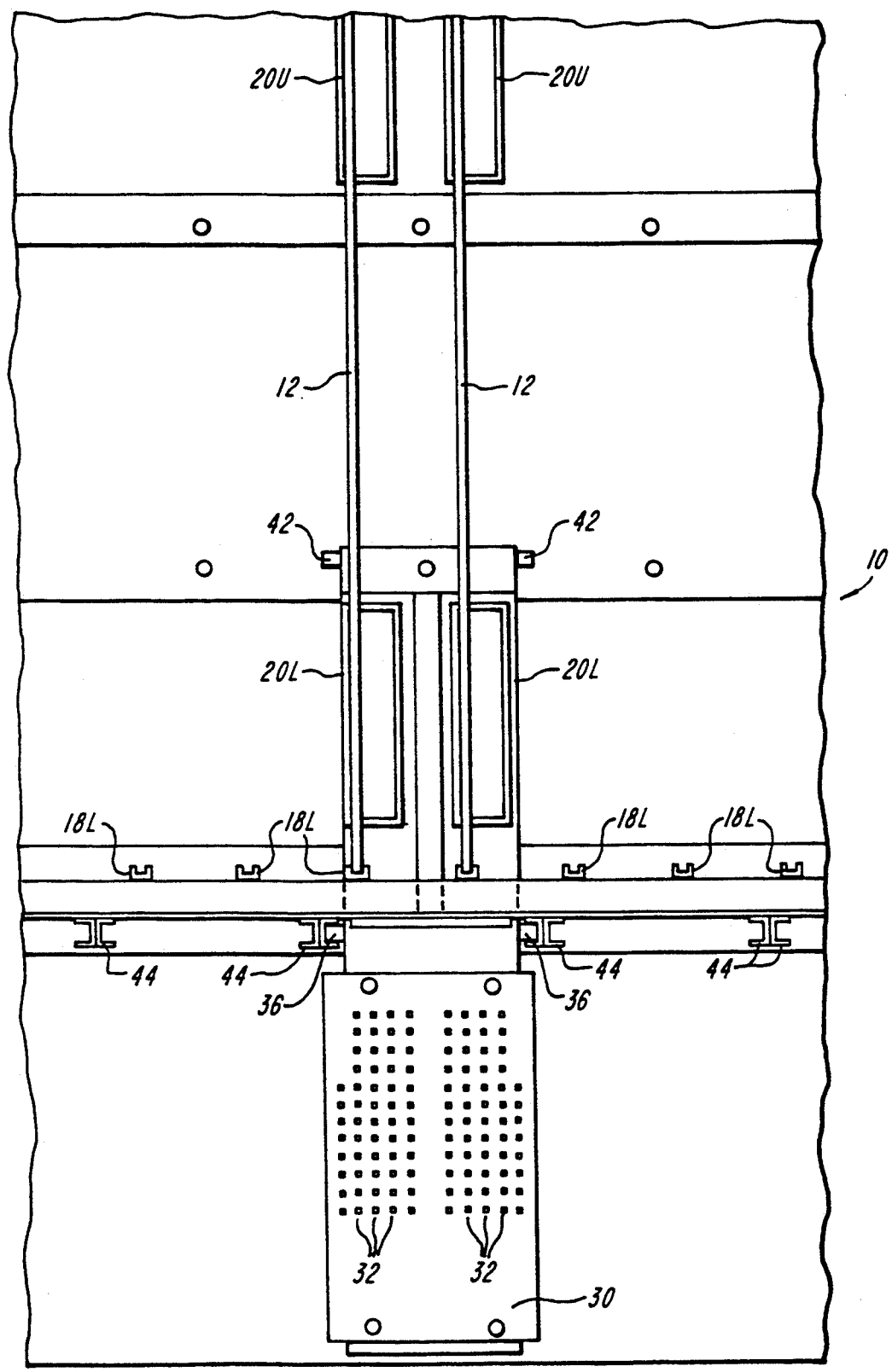
FIG. 1 is a front elevation view of a portion of a platform in accordance with a first embodiment of the invention.

The various embodiments of this invention relate to an electronic circuit platform 10 which may have a plurality of circuit boards or other circuit modules 12 mounted therein. In addition to having electronic circuitry for switching or other purposes, each circuit module 12 has an upper connector 14U and a lower connector 14L extending from its rear surface, and has upper and lower guides 16U and 16L, respectively, which are adapted to ride in corresponding runners 18U,18L (only the lower ones 18L of which are shown) Of the platform to physically support circuit module 12 in the platform.

Platform 10 has two connectors 20U and 20L for each circuit board module. For the preferred embodiments shown in the figures, upper connectors 20U may be hard-wired as part of the backplane and may be utilized for interconnecting circuit modules in the platform. Changes in external wiring therefore do not affect these connectors. In accordance with the teachings of this invention, lower connectors 20L are part of a removable backplane module 22, which modules are somewhat different for the two embodiments of the invention. The lower connectors interface with external circuits and are therefore the I/O connectors for the circuit module. These are the connectors which need to be changed for different types of circuit modules.

Referring first to the embodiment of the invention shown in FIGS. 1 and 2A-2C, each backplane module 22 has a center section 24, a front end section 26, and a rear end section 28. End sections 26 and 28 each project at a right angle from center section 24 with section 26 projecting downward and section 28 projecting upward. A connector 20L is mounted in rear section 28 of the backplane module for each circuit module to be serviced by the backplane module and an I/O board 30, having a plurality of connector pins 32 extending therefrom, is mounted to the forward section 26. Connector 20L and I/O board 30 are interconnected by electrical cable 34. Where, as shown in the figures, each backplane module supports two circuit modules, I/O board 30 may have two sections and a separate cable 34 may be provided to connect each section of the I/O board to the corresponding connector 20L.

A slider 36 extends from each side of backplane module 22 at approximately the junction of sections 24 and 26. Additional sliders 38 and 40 extend from each side of middle section 24 at points along this section and a slider 42 extends from each side of back section 28 at a point near the top thereof.

The sliders 36, 38, 40 and 42 on each side of backplane module 22 are adapted to ride in a corresponding rail 44 mounted to platform 10 on either side of the module. Each rail has a pair of openings 46 and 48 formed in its lower surface and an opening 49 formed in its upper surface near the rear thereof. The functions of these openings will be described later.

Each backplane module 22 also has a clip 50 attached to the top of center section 24 at roughly the midpoint thereof, the function of which will also be described later. At least one, and preferably two, alignment holes 52 are formed in the back of rear section 28 near the top thereof and a hole or holes 54 are provided near the bottom of board 30 through which a suitable platform fastener 56 may extend to secure backplane module 22 in platform 10. Where I/O board 30 is shorter than front section 26, hole 54 for fastener 56 will be provided in front section 26.

Platform 10 has runner 18L mounted to cage assembly 60. Cage assembly 60 includes hollow bars 62 and 64 which extend across platform 10 to support the cage assembly and which bars the backplane module 22 must be maneuvered past for insertion and removal. The rear of platform 10 includes a housing member 66 to which connectors 20U are mounted. There is a pin 68 extending from housing member 66 for each hole 52 in backplane module 22, a pin 68 and hole 52 mating to properly align the backplane module in the platform so that the connectors 14 of a circuit module will mate with the corresponding connectors 20 of the backplane. A bar 70 extends across the bottom of platform 10 with a hole 72 being provided in bar 70 for each fastener 56.

In operation, a backplane module is initially positioned in platform 10 by fitting the slider 42 on either side of the module into the front end of corresponding rails 44. The backplane module 22 is then moved backward, with sliders 42 riding in rails 44 and module 22 preferably oriented generally as shown in FIG. 2A until sliders 36 are adjacent to the front end of rails 44. The sliders 36 on each side of module 22 are then fitted into the corresponding rails 44 and the rearward movement of module 22 is continued with both sliders 42 and 36 riding in rails 44 until the module reaches approximately the position shown in FIG. 2A. At this point, the module 22 has cleared both rails 62 and 64 and has completed an initial lateral segment of its travel path.

At this point, the module is pivoted upward about the sliders 36 in rails 44, with each slider 42 passing up through the corresponding opening 49 in the top of the rails. This pivoting continues with slider 38 passing into rail 44 through opening 46 and slider 40 passing into rail 44 through opening 48, until the module reaches the orientation shown in FIG. 2B. At this point, the backplane module has completed a second pivot segment of its travel path.

The final lateral segment of the backplane module's travel path involves moving the module laterally backward with sliders 36, 38 and 40 on each side of module 22 riding in the corresponding rail 44. As this rearward motion continues, the forward portion of clip 50 rides over a rear lip 70 of cage assembly 60 and the one or more openings 52 in the rear of backplane module 22 fit over the corresponding pins 68 to assure proper alignment of the backplane module in the platform.

Figure 2B:
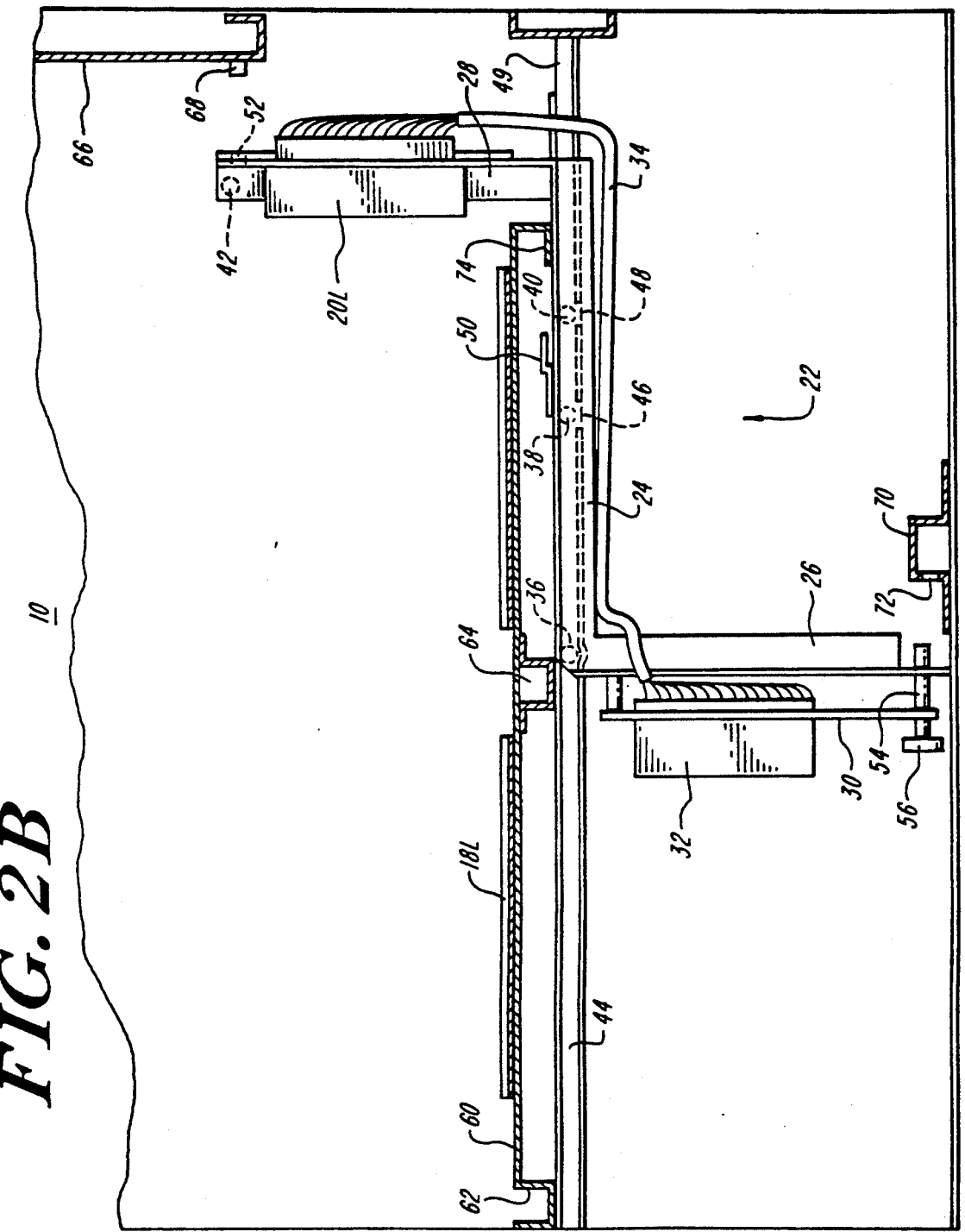
Figure 2C:
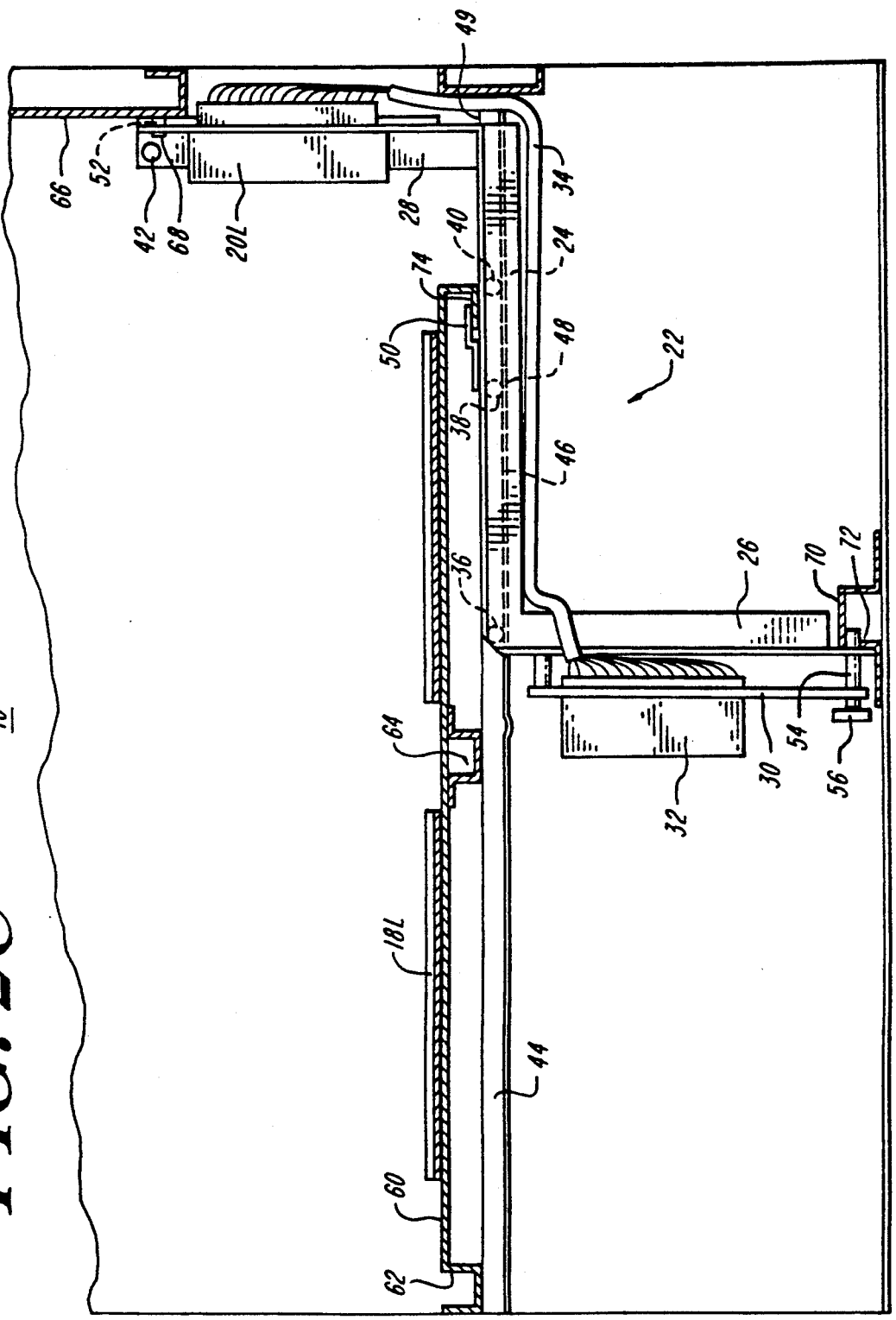
Figure 3:
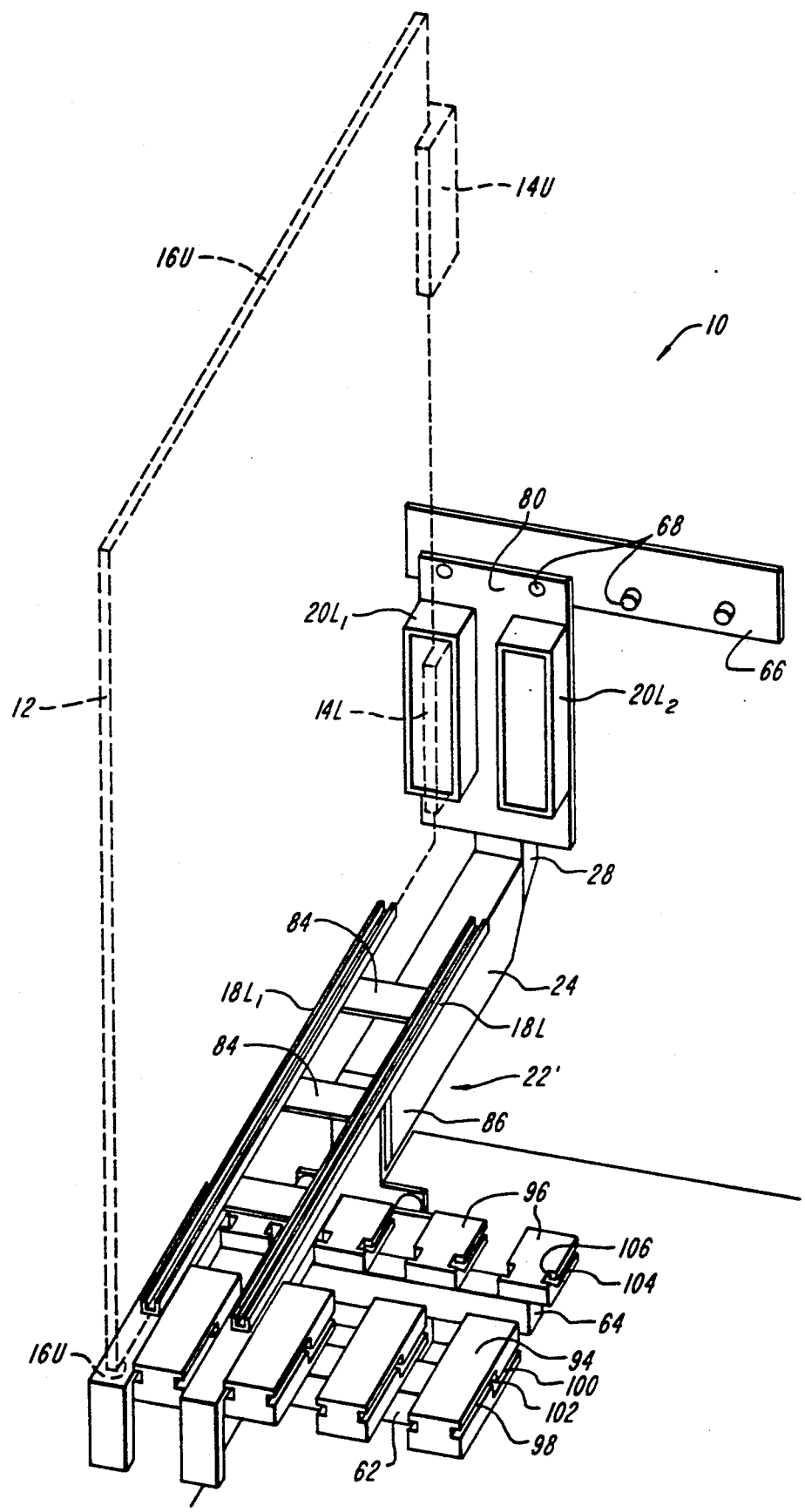
FIG. 3 is a front-top perspective view of a portion of a platform for an alternative embodiment of the invention.
Figure 4:
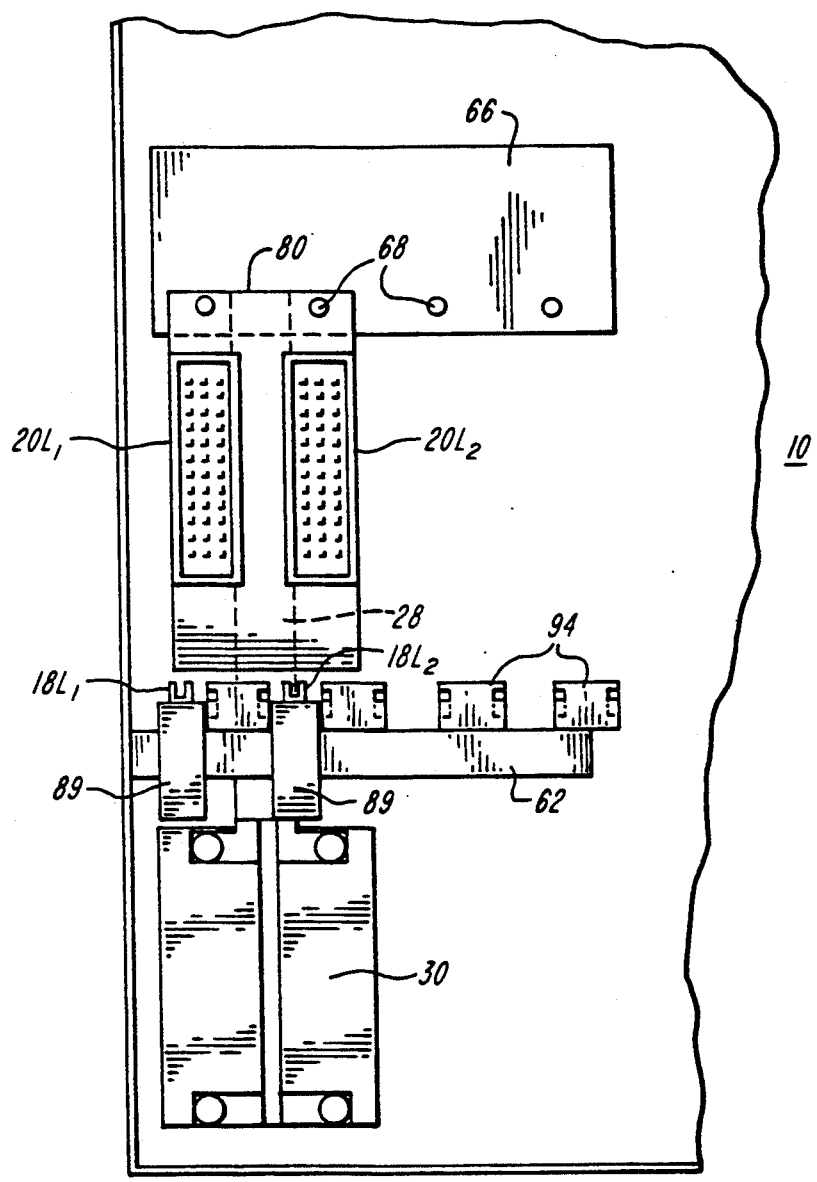
FIG. 4 is a front elevation view of the platform portion shown in FIG. 3.

When this lateral section of the travel path is completed, the backplane module is properly positioned in platform 10 in the position shown in FIG. 2C. At this point, fastener 56 is engaged with rail 70 of the platform housing through opening 72 to secure the backplane module in platform 10. The final step in providing a new backplane module in platform 10 is to attach suitable wiring to pins 32 of I/O board 30 for the circuit modules 12 to be used with the backplane module. While the I/O boards shown in the figures are for TI cable, backplanes for other types of wiring, such as coaxial cables terminated in multipin plugs or fiber optic cables, would have suitable I/O boards 30 with suitable connector elements in lieu of the pins 32. Connections made to I/O board 30 are electrically coupled to connector 20L through cable 34. Once a backplane module is fully installed, a circuit module 12 or circuit modules may be installed in the platform position(s) of the new backplane module.

When it is desired to remove a backplane module 22 so that it may be replaced with a new module, the sequence of operations described above is reversed. In particular, circuit modules 12 are removed, electrical connections to I/O board 30 are disconnected, fastener 56 is released and the I/O module is slid forward to the position shown in FIG. 2B. The backplane module then undergoes the pivot portion of its travel path with the platform being pivoted downward about the sliders 36 until the sliders 42 pass through hole 49 and engage the bottom of rail 44. At this point, the backplane module is in the position shown in FIG. 2A. The I/O module is then removed from the platform by sliding the module forward under rails 62 and 64 until first sliders 36 and then sliders 42 exit the forward end of rail 44. The platform is then ready to receive a new backplane module 22 for a new type of circuit module.

FIGS. 3, 4 and 5A-5D illustrate a second embodiment of the invention which differs from the embodiment described above in that the backplane modules 22' are lowered into platform 10 from above rather than being raised into the platform from below to maneuver around bars 62 and 64, and in that runners 18L are mounted on the backplane module rather than being part of the platform cage. In particular, module 22' has a main section 24, a front end section 26 and a rear end section 28 the same as for the earlier embodiment. Connectors 20L1 and 20L2 are mounted to a plate 80 attached to rear section 28, which plate also has alignment openings 82 formed therethrough for mating with alignment pins 68. I/O board 30 having connector pins 32 is mounted to forward section 26. Cabling 34 selectively interconnects connectors 20 and pins 32. Runners 18L1 and 18L2 are secured together by interconnect plates 84 with the rear two interconnect plates 84 being secured to a collar 86 which fits around and is secured to center section 24. An end bracket 88 is attached to and extends from the front underside of each runner 18, the bracket having a projection 89 extending down from its forward end. Each bracket 88 has a forward slider 90 and a rear slider 92 extending from each side thereof.

A forward rail assembly 94 is mounted to forward bar 62 of platform 10 and a rear rail assembly 96 is mounted atop rear bar 64. Rail assembly 94 has a track formed therein with a forward horizontal section 98 and a rear horizontal section 100 interconnected by a vertical section 102. As is discussed in greater detail later a stop or detent may be provided at the junction of sections 100 and 102. Rail assembly 96 has a horizontal track 104 formed therein with an opening 106 formed in the top of the rail.

Figure 5A:
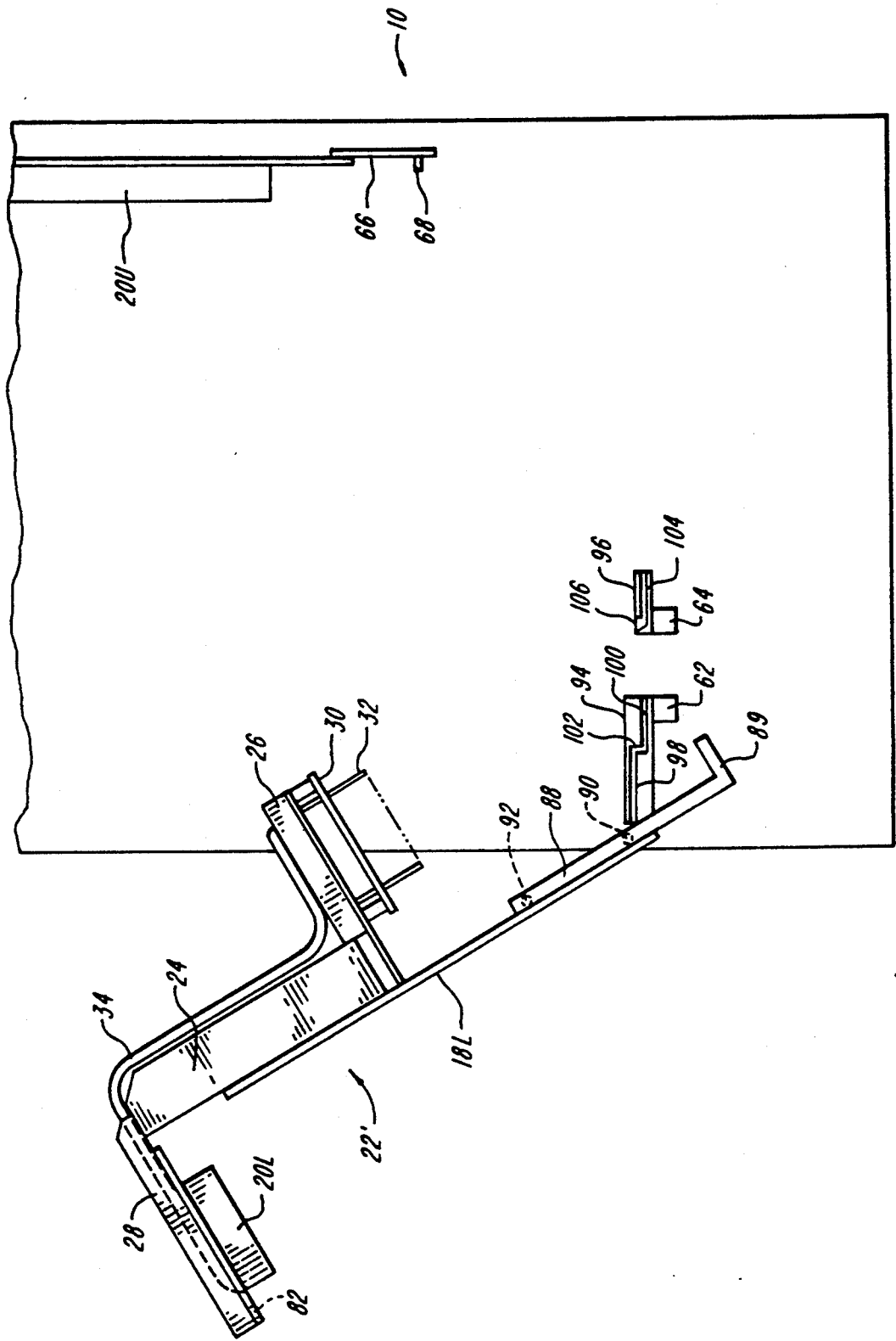
FIGS. 5A–5D are partially broken away side elevation views taken generally along the line 5—5 in FIG. 4 at various stages of insertion for a backplane module.

In operation, when a backplane module 22' is to be installed, the module is initially positioned and oriented generally as shown in FIG. 5A and sliders 90 on either side of the module are fitted in the front end of section 98 of the track in the corresponding rail assembly 94. The backplane module is then moved rearward with sliders 90 riding in track section 98, and with the backplane module oriented generally as shown in FIGS. 5A and/or 5B until the sliders 98 reach section 102 of the track. At this point, the sliders drop down in section 102 of the track so that the module 22' is generally in the position and orientation shown in FIG. 5B. This completes the initial lateral portion of the modules-travel path.

Figure 5B:
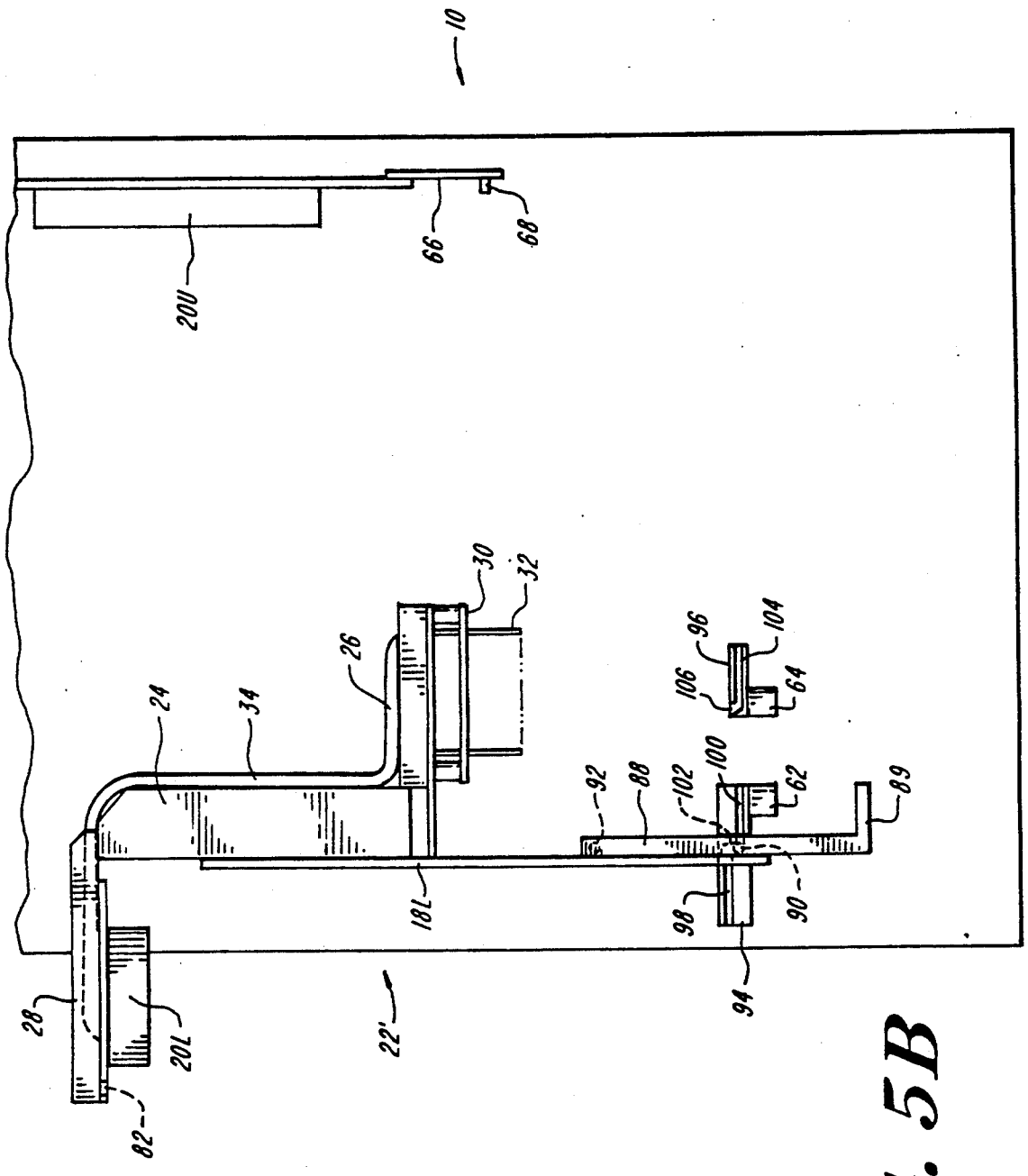
Figure 5C:
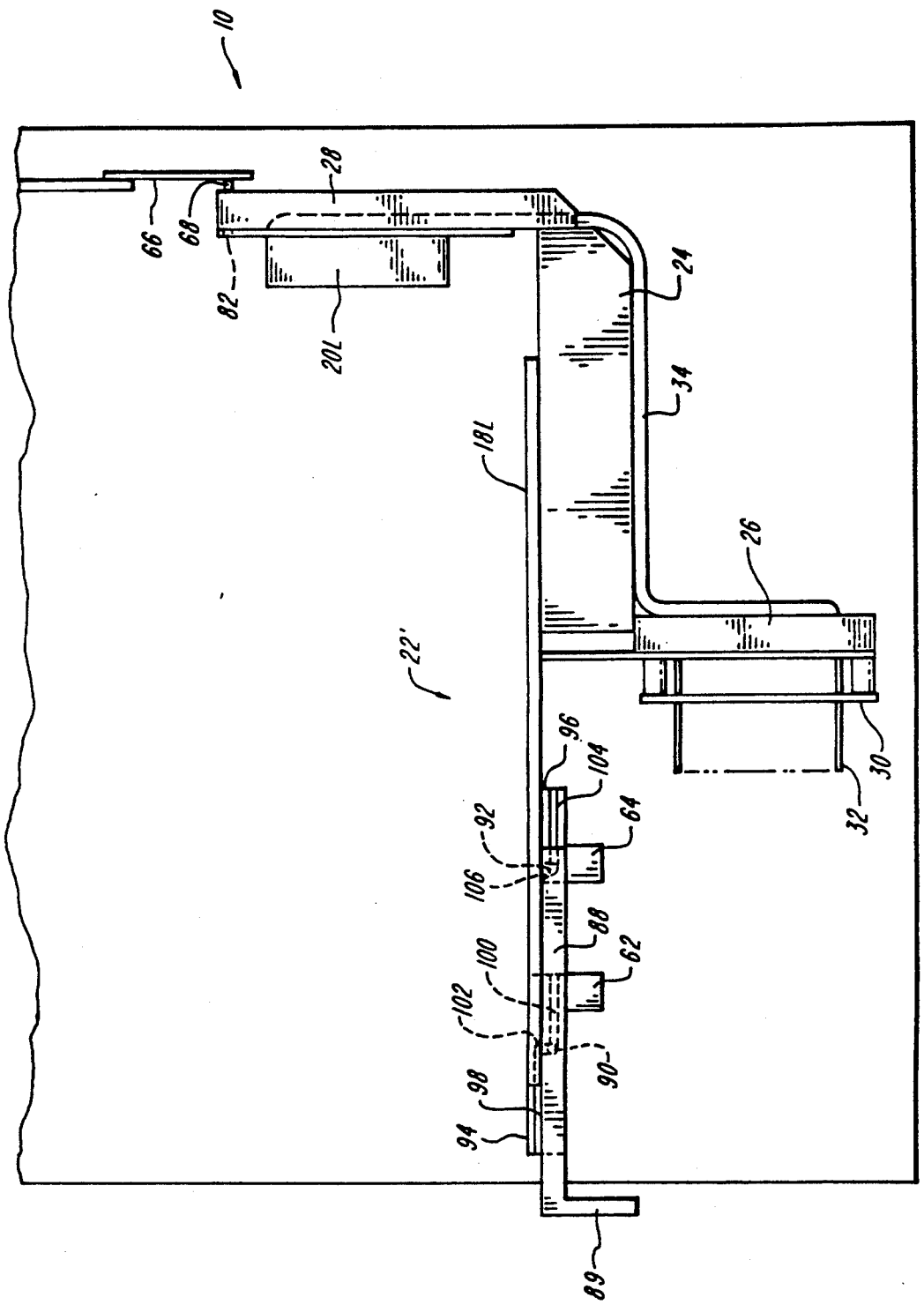

When the module is in the position shown in FIG. 5B, it is preferable that the sliders 90 be locked or detented in the position shown as the rear end of the module is pivoted downward about the sliders 90 until rear slider 92 passes through opening 106 in the top of track 104 and comes to rest in the track as shown in FIG. 5C. At this time, the module is oriented as shown in FIG. 5C. The locking or detenting of sliders 90 may be accomplished in a number of ways. For example, each slider may have an elliptical shape or may have a fin or other extension such that, with track section 98 being slightly wider than track section 100, the slider is too wide to fit in track section 100 when oriented as shown in FIG. 5B, but can fit into track section 100 when oriented as shown in FIG. 5C. Alternatively, a piece of spring material can extend across the forward end of track section 100, the forward section of this track may have an elastomer collar, or some other means may be provided, to inhibit entry of slider 90 into track section 100 as module 22' is being pivoted, but which can permit the slider to enter track section 100 when the module is oriented as shown in FIG. 5C and the module is pressed rearward with enough force to overcome the detent.

Figure 5D:
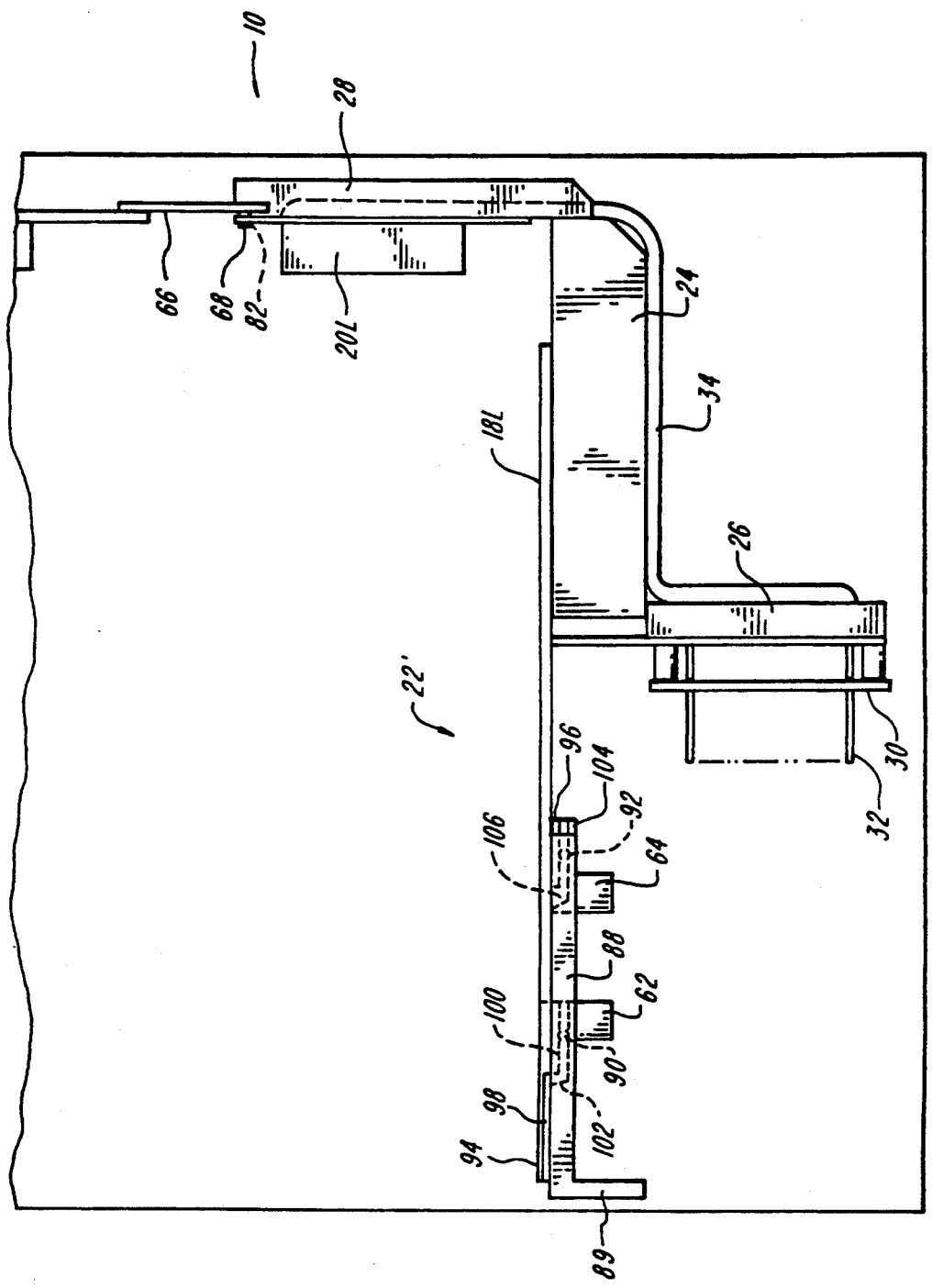

The final portion of the module travel path involves moving the module rearward, with slider 90 riding in track section 100 and slider 98 riding in track 104, until the pins 68 on housing plate 66 pass through holes 82 in connector support plate 80 to properly orient the module in its final position. This position is shown in FIG. 5D. While not shown for this embodiment of the invention, a fastener 56 could be provided to secure backplane module 22' to the platform in the same manner shown for the earlier embodiment, or other suitable means could be provided for performing this function. The final steps in the operation are to make electrical connections as appropriate to pins 32 of I/O board 30 and to insert appropriate circuit modules 12.

When it is desired to remove a backplane module so that different types of circuit boards may be used therewith, the process described above is reversed. In particular, any circuit modules in the backplane module are removed, electrical connections to I/O board 30 are removed, a fastener 56, if present, is opened and the module is moved forward, by for example hooking a finger under forward projection 89 at the end of bracket 88, to the position shown in FIG. 5C. The rear end of the module is then pivoted upward by, for example, pressing down on the forward end of bracket 88 until the module is in the position shown in FIG. 5B, and the module is then lifted slightly to move sliders 90 into track section 98. Module 22' is then pulled forward until sliders 90 leave the forward end of the tracks. The platform is then ready to have another backplane module inserted therein, for example, for a different type of circuit module, in the manner described above.

A flexible backplane suitable for use with various types of circuit modules is thus provided where the travel path of each replaceable backplane module is fully controlled during insertion and removal to prevent any contact with adjacent circuit modules. Backplane modules may thus be replaced while adjacent circuits are in operation without risk of damage or injury. All wiring to the backplane modules may also be made from the front of the module, simplifying the procedures for rewiring a platform in the field and eliminating the need for running additional cables into the backplane to provide for future use of different circuit types.

While two different embodiments are shown in the drawings to illustrate controlled insertion and removal of backplane modules from either above or below structural support bars or other structural elements of a platform, it is apparent that these embodiments are for purposes of illustration only, and that many variations in rail and slider configuration in particular, and in the guidance mechanism for the travel path of the backplane modules in general, are possible. For example, a greater or lesser number of guide rails could be provided which coact with appropriate sliders or other elements on the backplane module to control the module travel path; or guide grooves could be provided in the modules which coact with sliders or other elements on the platform to guide the travel path.

The alignment elements shown, the I/O boards utilized and the fasteners where employed are also for purposes of illustration and other suitable elements known in the art could be utilized for performing these functions. With suitable tolerances on the guides, the alignment elements might also be dispensed with.

In addition, while the travel path for the preferred embodiments to maneuver around platform structural members is in three sections, a first section to move past the structural members with the module in an angled orientation, a pivot section to bring the module to the desired orientation, and a final section to move the properly oriented module to its final position, with proper tolerances, it may be preferable to eliminate the final section of the travel path. In particular, for the embodiment shown in FIGS. 3, 4 and 5A-5D, the lock discussed above for the sliders 90 at the pivot point might be a precise lock so that, when the module 22' completes the pivot section of its travel path, it is in the final position shown in FIG. 5D. For this embodiment, alignment pins 68 would be eliminated and either the lock on slider 90 would be relied on for alignment or some other suitable alignment mechanism used.

While each backplane module has been illustrated as servicing two circuit modules for the illustrated embodiments, each backplane module may be designed to accomodate a selected one or more circuit modules. All or only selected ones of the backplanes in a given platform may be replacable. Also, while runners have been shown for the two embodiments as being placed either on the platform or on the replaceable backplane module, the runners may be positioned either way for various embodiments of the invention.

Further, while for the preferred embodiments shown in the drawings, each circuit board has two connectors with only one of the mating connectors on the backplane being replaced, the invention could be practiced with circuit boards having only a single connector, or replaceable backplane modules having two connectors could be used. In addition, while for most applications it is preferable to have I/O board 30 permitting electrical connections to be made from the front, in some applications, there may be sufficient space behind the backplane so that connections can be made from the rear. In such applications, I/O boards 30 may be eliminated and at least part of the portion 26 of the backplane module for supporting the I/O board may also be eliminated. Thus, while the invention has been particularly shown and described above with reference to preferred embodiments, the foregoing and other changes in form and detail may be made therein by one skilled in the art without departing from the spirit and scope of the invention.

What is claimed is:

1. A platform for mounting a plurality of replaceable circuit modules, each having at least one circuit connector extending from the rear thereof, the platform comprising:

at least one replaceable backplane module, said backplane module having a plurality of sliders, at least one backplane connector which is matable with the circuit connector, and means for making electrical connections to said at least one backplane connector; and rails positioned on opposite sides of each replaceable backplane module in which rails said sliders ride during at least a portion of a travel path for the backplane module during insertion and removal thereof.

2. A platform as claimed in claim 1 wherein said platform has a plurality of replaceable backplane modules.

3. A platform as claimed in claim 2 wherein each of said circuit modules has two circuit connectors, wherein each replaceable backplane module has one backplane connector for mating with one of the circuit connectors of a corresponding circuit module, and wherein said platform includes an additional, non-replaceable backplane connector for each circuit module positioned to mate with the other circuit connector when the circuit module is properly positioned in the platform.

4. A platform as claimed in claim 1 wherein each backplane connector is toward the rear of the platform when the circuit module is positioned in the platform, and wherein each backplane module includes means for making electrical connection to each said backplane connector from the front of the platform.

5. A platform as claimed in claim 4 wherein said means for making electrical connection includes an I/O board mounted to the front of each backplane module, and electrical conductors interconnecting the I/O board and said at least one backplane connector.

6. A platform as claimed in claim 1 including at least one first alignment element on each backplane module, and at least one second alignment element on the platform which mates with a corresponding said first alignment element when the backplane module is properly positioned in the platform.

7. A platform as claimed in claim 6 wherein one of said first and second alignment elements is a pin and the other of said alignment elements is a mating hole.

8. A platform as claimed in claim 1 including means for releasably fastening the backplane module to the platform when the backplane module is properly positioned therein.

9. A platform as claimed in claim 1 including a cage assembly for mechanically supporting each circuit module in the platform, said rails being positioned below said cage assembly.

10. A platform as claimed in claim 9 wherein said backplane module has a main section with an end section containing said backplane connector extending at a generally right angle from the back end of said main section, and wherein there is at least one slider on either side of said main section and at least one slider on either side of said end section.

11. A platform as claimed in claim 10 wherein both slider on each side of the module ride in a corresponding said rail during a forward portion of the backplane module travel path, and including an opening in a rear portion of each rail through which said end section sliders may project when such sliders are in said rear portion.

12. A platform as claimed in claim 11 wherein said main section is substantially parallel to said rails when the backplane module is properly positioned, the backplane module being pivotable to so orient the main section during module insertion when the end section slider is in said rear portion, the backplane module when rotated being forward of its proper position in the platform, continued rearward movement of the main section sliders in the rails permitting mating of the first and second alignment elements to properly position the backplane module in the platform.

13. A platform as claimed in claim 10 wherein each backplane module also has an end section extending at a generally right angle from the front end thereof, the front end section extending in the opposite direction from the rear end section, an I/O board mounted to each front end section, and electrical conductors interconnecting the I/O board and a backplane connector of the backplane module.

14. A platform as claimed in claim 1 wherein each backplane module includes a runner assembly for mechanically guiding and supporting a said circuit module.

15. A platform as claimed in claim 1 wherein each backplane module includes a main section with an end section containing said backplane connector extending at a generally right angle from the back end of said main section, and wherein there are at least a forward and a rear slider on either side of said main section.

16. A platform as claimed in claim 15 wherein the forward one of said sliders on each side of said main section rides in a corresponding rail to a predetermined position on the rail, with the back-end section above the proper position, the back-end section being pivotable downward about the forward sliders when at said predetermined position until the rear slider on each side is positioned on a corresponding rail, both sliders on either side of the main section riding in a corresponding rail as the backplane is moved rearward during backplane module insertion until the first and second alignment elements mate to properly position the backplane module in the platform.

17. A platform as claimed in claim 15 wherein each backplane module also has a section extending at a substantially right angle from a forward position on the main section, the forward section extending in the opposite direction from the end section, an I/O board being mounted to each forward section, and electrical conductors interconnecting the I/O board and a second connector of the backplane module.

18. A platform for mounting a plurality of replaceable circuit modules, each having at least one circuit connector extending from the rear thereof, the platform comprising:
at least one replaceable backplane module, said backplane module having guide means, at least one backplane connector which is matable with a said circuit connector, and means for making electrical connection to said at least one backplane connector; and
means for coacting with the guide means to control a travel path for the replaceable backplane module during insertion and removal thereof.

19. A platform as claimed in claim 18 wherein said travel path includes at least two path segments, a pivot segment during which the module is pivoted at a pivot position between the module orientation when in its fully inserted position and an angled orientation for facilitating insertion and removal of the backplane module with respect to the platform, and a lateral segment performed with the backplane module generally in the angled orientation during which the backplane module is moved between a forward end of the platform and the pivot position, said means for coacting controlling movement of the backplane module during both path segments.

20. A platform as claimed in claim 19 wherein said travel path includes a second lateral segment during which the module is oriented in its fully inserted orientation and is moved laterally to or from a fully inserted position, said means for coacting controlling movement of the backplane module during all three segments.

21. A backplane module which may be removably mounted in a platform having backplane guide means and which may when mounted in the platform support at least one removable circuit module having a circuit connector, the backplane module comprising:
a module body;
a backplane connector, matable with the circuit connector, mounted to a rear portion of the module body;
guide means on said module body for interfacing with the platform guide means to define a travel path for the backplane module during insertion and removal of the module;
means for making electrical connection to the backplane connector, and
wherein said means for making electrical connection includes an I/O board mounted to a front portion of said module body, and electrical conductors interconnecting said I/O board and said backplane connector.

22. A backplane module as claimed in claim 21 wherein said platform has first alignment means, and wherein said module includes second alignment means for coacting with the first alignment means to properly align the module in the platform.

23. A backplane module as claimed in claim 21 wherein the platform guide means are rails, and wherein the module guide means are sliders which are adapted to selectively ride in said rails during at least selected portions of said travel path.

24. A backplane module as claimed in claim 21 wherein said module body has a main section, a rear section extending at a generally right angle in a first direction from the rear of said main section, the backplane connector being mounted on said rear-end section, and a forward section extending at a generally right angle from a forward portion of said main section, the I/O board being mounted to said forward section.

25. A method for permitting replaceable backplane modules to be maneuvered around platform structural elements during insertion and removal of the modules in the platform comprising the steps of:
(a) pivoting the module at a pivot position, rearward of a point where the module would contact said platform structural elements if the module were in its fully inserted orientation, between said fully inserted orientation and an angled orientation where the module will not contact said structural elements when moved forward of the pivot point; and
(b) guiding the module through a lateral section of its travel path with the module generally in the angled orientation, the second lateral section being between the pivot point and the forward end of the platform;

steps (a) and (b) being performed in that order for removal of a backplane module from the platform and in reverse order for the insertion of a module into the platform.

26. A method as claimed in claim 25 including the step of:
(c) guiding the module through a second lateral section of its a travel path with the module oriented in its fully inserted orientation, the second lateral section being between a fully inserted position for the module and said pivot position;

steps (c), (a) and (b) being performed in that order for removal of a backplane module and in reverse order for insertion.

* * * * *